(12) United States Patent
Han

(10) Patent No.: US 9,911,943 B2
(45) Date of Patent: Mar. 6, 2018

(54) ORGANIC LIGHT-EMITTING DISPLAY DEVICE INCLUDING BUFFER LAYERS

(71) Applicant: LG DISPLAY CO., LTD., Seoul (KR)

(72) Inventor: Myungwoo Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/867,742

(22) Filed: Sep. 28, 2015

(65) Prior Publication Data

US 2016/0093827 A1 Mar. 31, 2016

(30) Foreign Application Priority Data

Sep. 29, 2014 (KR) ........................ 10-2014-0130103

(51) Int. Cl.
*H01L 51/52* (2006.01)
*H01L 27/32* (2006.01)

(52) U.S. Cl.
CPC ...... *H01L 51/5246* (2013.01); *H01L 27/3244* (2013.01); *H01L 27/3246* (2013.01); *H01L 27/3248* (2013.01); *H01L 2251/301* (2013.01); *H01L 2251/5315* (2013.01); *H01L 2251/558* (2013.01); *H01L 2251/566* (2013.01)

(58) Field of Classification Search
CPC ................................ H01L 51/52; H01L 27/32
USPC ............................ 257/40; 313/512, 504, 505
See application file for complete search history.

(56) References Cited

U.S. PATENT DOCUMENTS

| | | | |
|---|---|---|---|
| 7,173,373 B2 * | 2/2007 | Yamada et al. ................ | 313/505 |
| 2002/0180371 A1 | 12/2002 | Yamazaki et al. | |
| 2003/0071569 A1 * | 4/2003 | Chung et al. .................. | 313/512 |
| 2004/0209186 A1 * | 10/2004 | Matsumoto ........... | C07C 309/00 430/270.1 |
| 2007/0114519 A1 * | 5/2007 | Hayashi .............. | H01L 51/5253 257/40 |
| 2008/0079360 A1 * | 4/2008 | Kubota ......................... | 313/505 |
| 2009/0218939 A1 * | 9/2009 | Shitagaki et al. ............. | 313/504 |
| 2013/0299789 A1 | 11/2013 | Yamazaki et al. | |
| 2014/0312337 A1 * | 10/2014 | Isobe .................. | H01L 51/5231 257/40 |

FOREIGN PATENT DOCUMENTS

CN 101160001 A 4/2008

* cited by examiner

*Primary Examiner* — Sheng Zhu
(74) *Attorney, Agent, or Firm* — Birch, Stewart, Kolasch & Birch, LLP

(57) ABSTRACT

An organic light-emitting display device is provided. The device can include a display area having an organic light-emitting element on a lower substrate; a bezel area surrounding the display area; a transparent encapsulation unit having first and second encapsulation layers, and a first particle cover; and a first buffer layer. The first encapsulation layer can cover the display area and the bezel area. The first particle cover layer can cover the display area and a portion of the bezel area adjacent to the display area. The first buffer layer, apart from the first particle cover layer, can cover another portion of the bezel area. The second encapsulation layer, which covers the first particle cover layer and the first buffer layer, contacts the first encapsulation layer at a contact surface between the first particle cover layer and the first buffer layer.

23 Claims, 7 Drawing Sheets

ORGANIC LIGHT-EMITTING DISPLAY DEVICE INCLUDING BUFFER LAYERS

CROSS-REFERENCE TO RELATED APPLICATIONS

This application claims the priority of Korean Patent Application No. 10-2014-0130103 filed on Sep. 29, 2014, in the Korean Intellectual Property Office, the disclosure of which is incorporated herein by reference.

BACKGROUND OF THE INVENTION

Field of the Invention

The present disclosure relates to an organic light-emitting display (OLED) device, and more particularly to an OLED device with improved production yields and reliability by eliminating the possibility that a portion of an adhesive layer used for attaching an upper substrate to a lower substrate is not attached on the substrates in a bezel area.

Description of the Related Art

An organic light-emitting display device (OLED) is capable of producing light on its own and thus does not require an additional light source, as in a liquid crystal display device (LCD). Therefore, an OLED device can be made lighter and thinner. Further, an OLED device has advantages in that it is driven with low voltage to consume less power and realizes better colors. Also, an OLED device has a fast response time, a wide viewing angle and a high contrast ratio (CR). For these reasons, an OLED device is currently under development as the next generation display device.

FIG. 1 a schematic cross-sectional view of a plurality of OLED devices disposed between mother substrates in the related art. FIG. 1 shows a first OLED device PA1 and a second OLED device PA2 when a lower mother substrate 190 is attached to an upper mother substrate 195. Although two OLED devices (PA1 and PA2) are defined on the lower mother substrate 190 in FIG. 1 for convenience of illustration, the number of the OLED devices defined on the lower mother substrate 190 is not limited to two.

In the related art, an OLED device is manufactured in such a manner that a plurality of thin-film transistors 120, a plurality of organic light-emitting elements 140, etc., are disposed between the lower mother substrate 190 and the upper mother substrate 195. The lower mother substrate 190 is attached to the upper mother substrate 195, and then the mother substrates are divided into individual organic light-emitting devices.

Referring to FIG. 1, the plurality of thin-film transistors 120 are disposed in a display area DA of the lower mother substrate 190. A gate insulating layer 131, an interlayer insulating layer 132 and a planarization layer 133 are disposed in the display area DA during the manufacturing process of disposing the thin-film transistor 120.

The plurality of organic light-emitting elements 140 are disposed on the planarization layer 133. A bank layer 134 is disposed around the plurality of organic light-emitting elements 140. In a bezel area BA, a variety of lines 160 and/or circuitry necessary for driving the display area DA may be disposed. In the bezel area BA, ends of the planarization layer 133 and the bank layer 134 have a tapered shape. Further, there is a step difference between the bezel area BA and the display area DA, which is approximately equal to the sum of the thickness of the planarization layer 133 and the thickness of the bank layer 134.

In addition, an encapsulation layer 135 for protecting the organic light-emitting element 140 from moisture and oxygen is disposed on the organic light-emitting element 140. When a plurality of OLED devices are manufactured simultaneously by using a set of mother substrates, the position of a cut line CUT along which one OLED device is separated from another is determined between adjacent bezel areas BAs. In addition, a buffer region is disposed closely to the cut line CUT in the bezel area BA. The buffer region is configured to absorb physical impacts, such as shocks or vibrations, generated when the cut line CUT is cut by a cutter or a laser. Therefore, no conductive lines or circuitry are disposed in the buffer region.

The upper mother substrate 195 is attached to the lower mother substrate 190 by an adhesive layer 170. However, in the bezel area BA of each of the first OLED device PA1 and the second OLED device PA2, there exists an unwanted space due to the step difference. Accordingly, the adhesive layer 170 may not be sufficiently filled up in the unwanted space or may not be securely attached to the upper mother substrate 195 and/or the lower mother substrate 190 at the boundary between the bezel area BA of the first OLED device PA1 and the bezel area BA of the second OLED device PA2. As a result, a space S where the adhesive layer is not properly attached on the substrates may be created in the bezel areas BA as shown in FIG. 1.

Due to the space S (which is an unwanted space) created in the bezel areas BA when the upper mother substrate 195 is attached to the lower mother substrate 190, pressure applied to the cut line CUT may result in bending or vibrations on the upper mother substrate 195 and the lower mother substrate 190. Shocks or physical impact may occur at this time and may be delivered to the conductive lines 160 and/or the circuitry disposed in the bezel area BA. If such impacts are applied to the bezel area BA, cracks or other types of damage may occur in various components including a variety of lines and insulating layers. Once cracks or damage occur in one component, it can very easily lead to cracks or damage in other components. Even if no cracks occur during the process of attaching the adhesive layer 170, cracks or damage may occur during other processes of cutting the set of mother substrates into individual OLED devices, such as a process of laser cutting or a process of mechanical scribing, in which strong energy is exerted on the upper mother substrate 195. Therefore, crack may still occur in the lines 160 or other components.

In addition, in the existing manufacturing process of an OLED device according to the related art, an additional process may be performed after the set of mother substrates has been cut into individual OLED devices. For example, a process of attaching a polarizing plate or a process of applying a protective film onto the upper substrate or the lower substrate using a roller may be performed. During such processes, cracks may occur in the lines 160 or insulating layers due to generated pressure. In addition, pressure is exerted on the lower substrate during a process of attaching a polarizing plate, whereby cracks may occur in the lines 160 or the insulating layers. Accordingly, cracks occur in the line 160 or the insulating layers due to the space S created in the bezel area BA, deteriorating the production yields and reliability of an OLED device.

As described above, in the OLED device according to the related art, there exists the space S where the adhesive layer 170 is not attached on the lower substrate. Accordingly, adhesive layer 170 and the lower substrate may peel off or otherwise not be attached properly, and the lower substrate may not be securely attached to the upper substrate. Therefore, delamination or process failure may be caused during subsequent processes. In addition, moisture or oxygen may permeate through the space S from a side surface of an OLED device, deteriorating the lifespan and reliability of the OLED device.

SUMMARY OF THE INVENTION

The inventors of the present disclosure have devised an OLED device having a novel structure for solving the above-described problems associated with the OLED devices according to the related art.

In view of the above, an object of the present disclosure is to provide an OLED device capable of minimizing a space where an adhesive layer is not attached on a substrate due to a step difference of an encapsulation layer.

Another object of the present disclosure is to provide an OLED device capable of reducing cracks occurring in lines during a process of attaching an upper substrate to a lower substrate and suppressing a substrate from being peeled off, by minimizing a space where an adhesive layer is not attached on a substrate.

It should be noted that objects of the present disclosure are not limited to the above-described object, and other objects of the present disclosure will be apparent to those skilled in the art from the following descriptions.

According to an aspect of the present disclosure, there is provided an organic light-emitting display (OLED) device comprising: a display area including a thin-film transistor and an organic light-emitting element on a lower substrate; a bezel area configured to surround the display area; a transparent encapsulation unit including at least a first encapsulation layer, a first particle cover layer and a second encapsulation layer; and a first buffer layer, wherein the first encapsulation layer, on the organic light-emitting element, covers the display area and the bezel area, wherein the first particle cover layer, on the first encapsulation layer, covers the display area and at least a portion of the bezel area adjacent to the display area, wherein the first buffer layer, apart from the first particle cover layer, on the first encapsulation layer, covers at least another portion of the bezel area, and wherein the second encapsulation layer, which covers the first particle cover layer and the first buffer layer, is in contact with the first encapsulation layer at a contact surface between the first particle cover layer and the first buffer layer.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
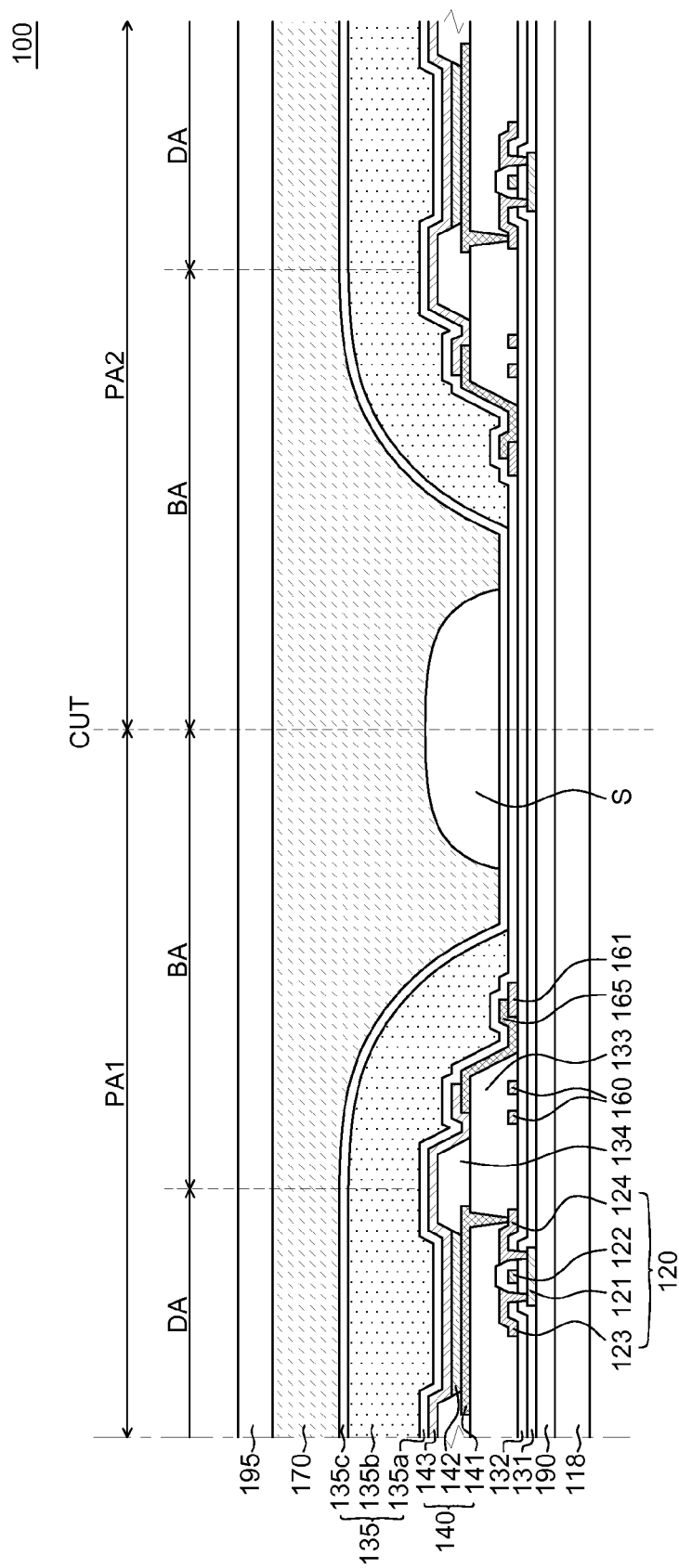
FIG. 1 a schematic cross-sectional view of a plurality of OLED devices disposed between mother substrates in the related art.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, numbers of elements given in the drawings are merely illustrative and are not limiting. Like reference numerals denote like elements throughout the descriptions. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B;" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
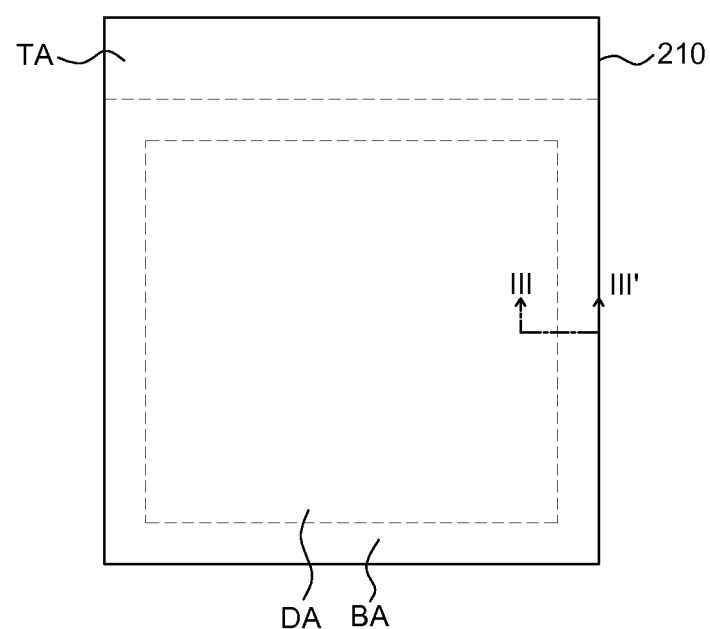
FIG. 2 is a schematic plan view for illustrating areas on a low substrate of an OLED device according to an exemplary embodiment of the present invention.
Figure 3:
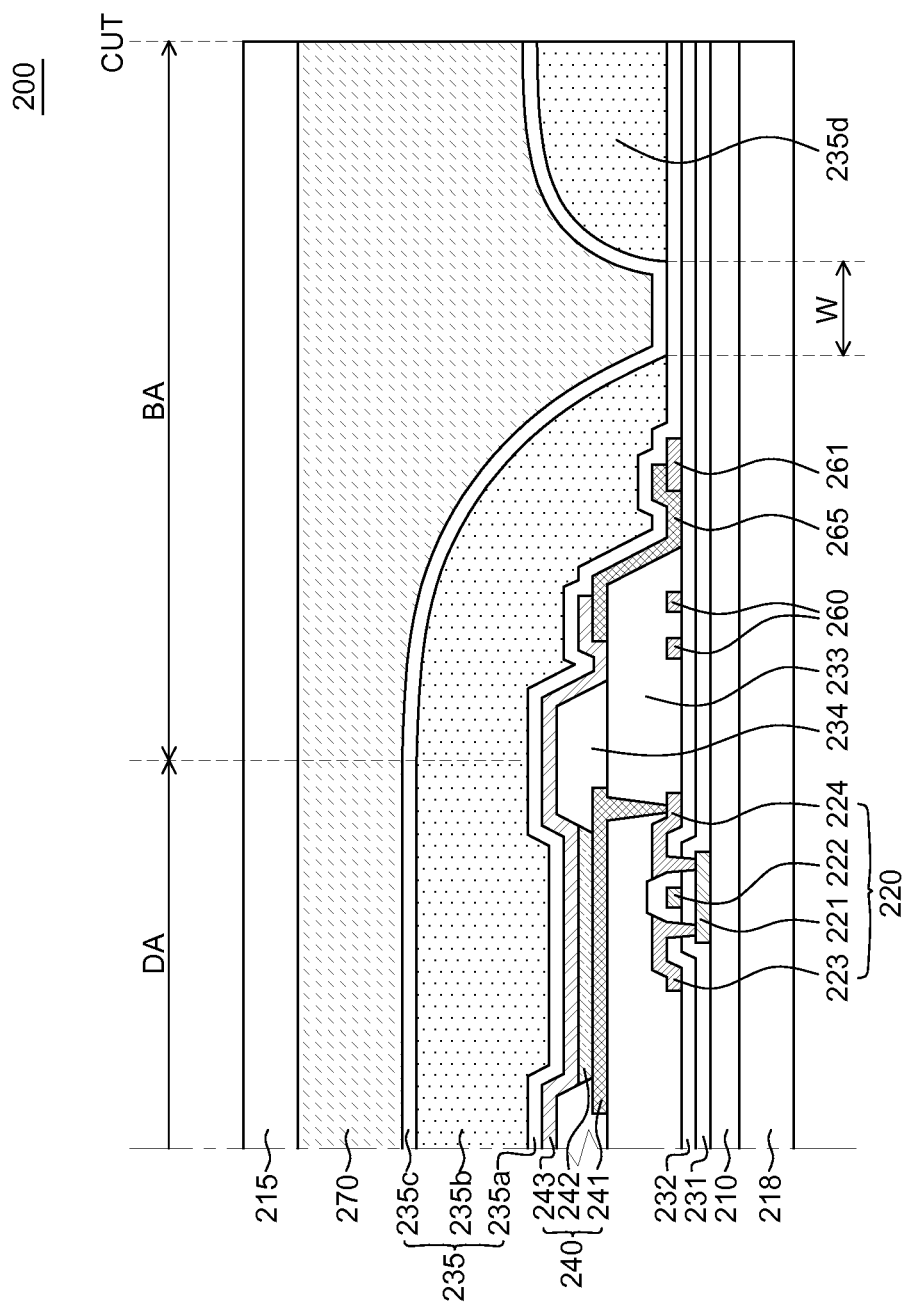
FIG. 3 is a schematic cross-sectional view of the OLED device according to an exemplary embodiment of the present disclosure, taken along line III-III' of FIG. 2.

FIG. 2 is a schematic plan view for illustrating areas on a lower substrate of an OLED device according to an exemplary embodiment of the present disclosure. FIG. 3 is a schematic cross-sectional view of the OLED device according to an exemplary embodiment of the present disclosure, taken along the line III-III' of FIG. 2. FIGS. 2 and 3 show an OLED device 200 after attaching an upper mother substrate to a lower mother substrate to cut them along a cut line CUT. All the components of the OLED devices according to the embodiments of the present invention are operatively coupled and configured.

Referring to FIGS. 2 and 3, the OLED device 200 includes a lower substrate 210, a thin-film transistor 220, an organic light-emitting element 240, a transparent encapsulation unit 235, an adhesive layer 270 and an upper substrate 215. In the following descriptions, one thin-film transistor 220 and one organic light-emitting element 240 will be described for convenience of illustration. However, more than one thin-film transistor and more than one organic light-emitting element 240 may be employed.

The OLED device 200 according to an exemplary embodiment of the present disclosure is of a top emission type in which light generated from the organic light-emitting layer 240 is emitted via the upper substrate 215. FIG. 3 shows only one sub-pixel region in a display area DA for the sake of simplicity.

The lower substrate 210 supports thereon a variety of elements of the OLED device 200. The lower substrate 210 is made of an insulative material that is suitable for being subjected to semiconductor deposition processes and supporting the thin-film transistor 220 and the organic light-emitting element 240 disposed on the lower substrate 210. Specifically, the lower substrate 210 may be made of a material having flexibility, e.g., flexible plastic, glass, polyimide, and the like.

For the lower substrate 210 made of a material having flexibility, it is desirable to dispose a back plate 218 for supporting the lower substrate 210. The back plate 218 acts as a protective film.

Referring to FIG. 2, the lower substrate 210 of the OLED device 200 includes a display area DA, a bezel area BA and a pad area TA. The display area DA refers to an area of the OLED device 200 where an image is displayed. The bezel area BA refers to an area of the OLED device 200 where no image is displayed and lines 260 and/or circuitry are disposed. The bezel area BA surrounds the display area DA. The pad area TA refers to an area of the OLED device 200 where a pad unit is disposed. An integrated circuit may be disposed in the pad area TA or a flexible printed circuit board may be connected to the pad area TA. The pad area TA may be disposed on a side of the bezel area BA.

Referring to FIG. 3, in the display area DA of the lower substrate 210, a thin-film transistor 220 is disposed, which includes an active layer 221, a gate electrode 222, a source electrode 223 and a drain electrode 224. Specifically, the active layer 221 is formed on the lower substrate 210. A gate insulating layer 231 for insulating the active layer 221 from the electrode 222 is formed on the active layer 221. The gate electrode 222 is formed on the gate insulating layer 231 above the active layer 221. An interlayer insulating layer 232 is formed over the gate electrode 222 and the gate insulating layer 231. The source electrode 223 and the drain electrode 224 are formed on the interlayer insulating layer 232. The source electrode 223 and the drain electrode 224 are electrically connected to the active layer 221. Herein, for convenience of illustration, only one of thin-film transistors of the OLED device 200 is illustrated, which is connected to the anode 241. In addition, although the thin-film transistor 220 has a coplanar structure herein, an inverted staggered thin-film transistor may also be used. Further, additional multi-buffer layers may be disposed between the lower substrate 210 and the thin-film transistor 220. The multi-buffer layers may be four layers formed by alternately stacking silicon nitride $SiN_x$ and silicon oxide $SiO_x$.

A planarization layer 233 is disposed on the thin-film transistor 220. The planarization layer 233 planarizes the area above the thin-film transistor 220. The planarization layer 233 includes a contact hole for electrically connecting the thin-film transistor 220 to the anode 241 of the organic light-emitting element 240. To amplify the luminous intensity, lens-like features may be patterned on a portion of the planarization layer 233 where the anode 241 is disposed.

The organic light-emitting element 240 is disposed on the planarization layer 233. The organic light-emitting element 240 includes the anode 241 formed on the planarization layer 233 to be electrically connected to the thin-film transistor 220, an organic light-emitting layer 242 formed on the anode 241, and a cathode 243 formed on the organic light-emitting layer 242. Since the OLED device 200 is of a top emission type, the anode 241 may include a reflective layer 244 for reflecting light generated from the organic light-emitting layer 242 toward the upper substrate 215 and a transparent conductive layer 245 for injecting holes into the organic light-emitting layer 242. Although the anode 241 includes the reflective layer 244 in FIG. 3, the anode 241 may include the transparent conductive layer 245 only and the reflective layer 244 may be formed separated from the anode 241.

The organic light-emitting layer 242 is an organic layer for emitting light of a particular color and may be one of red, green, blue and white organic light-emitting layer. The organic light-emitting layer 242 may be formed on the entire display area DA of the lower substrate 210, which is the case of the white organic light-emitting layer 242. Although the thickness of the organic light-emitting element 240 is exaggerated in FIG. 3 for the sake of clarity, the organic light-emitting element 240 is actually much thinner than the adhesive layer 270. That is, the thickness as illustrated in the figures is merely for describing the features of the present disclosure and the present disclosure is not limited by the figures. In some embodiments, for the white organic light-emitting layer 242, a color filter or color refiner may be formed above the organic light-emitting element 240.

A bank layer 234 is disposed over the anode 241 and the passivation layer 233. The bank layer 234 defines a sub-pixel region by separating adjacent sub-pixel regions in the display area DA. In addition, the bank layer 234 may define a pixel region including a plurality of sub-pixel regions. The bank layer 234 is extended from the display area DA to a portion of the bezel area BA.

The conductive lines 260 are disposed in the bezel area BA of the lower substrate 210. The lines 260 are electrically connected to the thin-film transistor 220 or the organic light-emitting element 240 formed in the display area DA to deliver signals. The lines 260 may be made of the same material as one of various conductive elements formed in the display area DA. The lines 250 may be made of, but is not limited to, the same material as the source electrode 223, the gate electrode 222 and/or the anode 241 as shown in FIG. 3. For example, in the bezel area BA, a gate electrode driving unit may be formed that is made of the same material as the source electrode 223 and the gate electrode 222 to apply a driving signal to the gate electrode 222. In addition, on the planarization layer 233 above the gate electrode driving unit, a connecting unit 265 that is made of the same material as the anode 241 and applies ground voltage VSS to the cathode 243 may be formed to be connected to a ground voltage line 261.

In FIG. 3, the gate insulating layer 231, the interlayer insulating layer 232, the planarization layer 233 and the bank layer 234 are all formed in the bezel area BA. However, some of the gate insulating layer 231, the interlayer insulating layer 232, the planarization layer 233 and the bank layer 234 may be selectively formed in the bezel BA.

In order to protect the organic light-emitting element 240 in the display area DA from moisture and oxygen, the transparent encapsulation unit 235 is disposed in the display area DA and the bezel area BA. In addition, the transparent encapsulation unit 235 is configured to transmit light generated from the organic light-emitting element 240.

Referring to FIG. 3, the transparent encapsulation unit 235 at least includes a transparent first encapsulation layer 235a, a transparent first particle cover layer 235b, and a transparent second encapsulation layer 235c. Furthermore, it is possible to include an additional transparent third encapsulation layer, an additional transparent second particle cover layer, and an additional transparent fourth encapsulation layer on the transparent encapsulation unit 235. But it is not limited thereto. Use of such additional layers depends upon the product to be manufactured and the desired encapsulation and/or particle coverage to be achieved.

The first encapsulation layer 235a and the second encapsulation layer 235c of the transparent encapsulation unit 235 can be made of a transparent inorganic substance. For example, the transparent inorganic substance may include silicon nitride ($SiN_x$), silicon oxide ($SiO_x$), aluminum oxide ($Al_xO_y$), etc.

The first particle cover layer 235b of the transparent encapsulation unit 235 can be made of a flowable, transparent organic substance. For example, the transparent organic substance may include an epoxy resin, an acryl resin, silicon oxycarbide (SiOC), etc.

The first particle cover layer 235b is disposed between the first encapsulation layer 235a and the second encapsulation layer 235c. The first particle cover layer 235b can fill cracks caused by foreign matter generated between the first encapsulation layer 235a and the second encapsulation layer 235c. In particular, cracks caused by foreign matter in the first encapsulation layer 235a or the second encapsulation layer 235c may result in defects in the transparent encapsulation unit 235. The first particle cover layer fills the cracks to reduce defects in the transparent encapsulation unit 235.

Referring to FIG. 3 again, in order to solve or address the problem relating to the poor attachment discussed above with respect to FIG. 1, a first buffer layer 235d for reducing step difference, which is made of the same material as the first particle cover layer 235b, is disposed in the bezel area BA adjacent to a cut line CUT. The first buffer layer 235d is configured to reduce an area between the upper substrate 215 and the lower substrate 215 at the bezel area BA such that the adhesive layer 270 fills up the reduced area at the bezel area BA. That is, the first buffer layer 235d is configured to reduce a gap difference of the display area DA and the bezel area BA. The first buffer layer 235d is configured to absorb shocks, impacts, vibrations, etc. generated when a cutter or a laser performs a cutting operation along the cut line CUT. The first buffer layer 235d is configured to help maintain a cell gap between the lower substrate 210 and the upper substrate 215. By forming the first buffer layer 235d, the space where the adhesive layer is not attached on the substrate in the bezel area BA can be reduced. Accordingly, with this configuration, the problem relating to the poor attachment can be improved.

The first encapsulation layer 235a and the second encapsulation layer 235c of the transparent encapsulation unit 235 seal the first particle cover layer 235b in the bezel area BA. Since the first particle cover layer 235b cannot effectively suppress moisture permeation, moisture and oxygen may permeate through the first particle cover layer 235b to result in defects in the organic light-emitting element 240. With the configuration according to an exemplary embodiment of the present disclosure, the first particle cover layer 235b is sealed by the first encapsulation layer 235 and the second encapsulation layer 235, so that the moisture and oxygen permeation path via the first particle cover layer 132 can be eliminated.

The first encapsulation layer 235a comes in direct contact with the second encapsulation layer 235c between the first particle cover layer 235b and the first buffer layer 235d, so that the make the first particle cover layer 235b is separated from the first buffer layer 235d. In addition, to ensure the separation between the first particle cover layer 235b and the first buffer layer 235d, the first particle cover layer 235b is spaced apart from the first buffer layer 235d by a predetermined distance.

Like the first particle cover layer 235b, the buffer layer 235d cannot effectively suppress moisture permeation, and thus moisture and oxygen may permeate through the buffer layer 235d. However, as the first particle cover layer 235b and the buffer layer 235d are separated and spaced apart from each other by the first encapsulation layer 235a and the second encapsulation layer 235c, the first particle cover layer 235b is sealed. Accordingly, moisture permeation path from the first buffer layer 235d to the first particle cover layer 235b can be eliminated. With the configuration according to an exemplary embodiment, the space where the adhesive layer is not attached on the substrate is reduced so that the problem relating to the poor attachment is solved, and the path via which moisture and oxygen permeate from the first buffer layer 235d to the first particle cover layer 235b can be eliminated or at least significantly minimized.

For example, the width W of a contact surface where the first encapsulation layer 235a meets the second encapsulation layer is determined depending on the distance by which the first buffer layer 235d is spaced apart from the first particle cover layer 235b.

In order to effectively disconnect the physical contact between the first particle cover layer 235b and the buffer layer 235d, the width W of the contact surface where the first particle cover layer 235b meets the buffer layer 235d is for example, at least 50 μm. If the width W of the contact surface is less than 50 μm, the first particle cover layer 235b and the first buffer layer 235d may be connected to each other to result in defects.

For example, the width W of the contact surface of the first encapsulation layer 235a and the second encapsulation layer 235c is equal to or less than 200 μm. If the width W of the contact surface is greater than 200 μm, a space with a step difference becomes larger, so that the problem relating to the poor attachment cannot be effectively solved.

Accordingly, the width W of the contact surface where the first encapsulation layer 235a meets the second encapsulation layer 235c may be between 50 μm and 200 μm, but not limited thereto. With the configuration according to an exemplary embodiment, it is possible to suppress defects occurring when the first particle cover layer 235d is connected to the first buffer layer 235d and also to solve the problem relating to the poor attachment or poor adhesion.

Further, in the OLED device 200 according to an exemplary embodiment of the present disclosure, the first buffer layer 235d can be formed together with the first particle cover layer 235 in the same process by simply modifying the mask for foaming the first particle cover layer 235, without an additional process.

According to an exemplary embodiment of the present disclosure, the OLED device 200 includes the display area DA including the thin-film transistor 220 and the organic light-emitting element 240 formed on the lower substrate 210 and the bezel area BA surrounding the display area DA. In addition, the first encapsulation layer 235a is formed on the organic light-emitting element 240 such that it covers the display area DA and the bezel area BA. On the first encapsulation layer 235a, the first particle cover layer 235b covers the display area DA and at least a portion of the bezel area BA adjacent to the display area DA. Further, the first buffer layer 235d covering at least another portion of the bezel area BA is formed on the first encapsulation layer 235a. On the first particle cover layer 235b and the first buffer layer 235d, the second encapsulation layer 235c covering the display area DA and the bezel area BA is formed. The first particle cover layer 235b is spaced apart from the first buffer layer 235d by a certain distance. The first encapsulation layer 235a and the second encapsulation layer 235c may come in contact with each other at the contact surface where the first particle cover layer 235b is spaced apart from the first buffer layer 235d by a predetermined distance, to thereby reduce the area of a space where the adhesive layer is not attached on the substrate.

The adhesive layer 270 is made of an adhesive material for attaching the upper substrate 215 to the lower substrate 210. Specifically, the adhesive layer 270 supports the transparent encapsulation layer 235 disposed on the upper substrate 215 and the lower substrate 210. The adhesive layer 270 may seal the organic light-emitting element 240 formed on the lower substrate 210 to protect the organic light-emitting element 240 from moisture and oxygen coming from outside the OLED device 200. That is, the adhesive layer 270 is configured to sufficiently fill the space between the transparent encapsulation unit 235 and the upper substrate 215 in the display area DA and the bezel area BA.

The adhesive layer 270 may be made of a variety of materials such as an optical clear adhesive (OCA) film, a liquid optical clear resin (OCR), etc. or combinations thereof. The adhesive material may have thermosetting or pressure-sensitive properties.

For example, the adhesive layer 270 of the OLED device 200 according to an exemplary embodiment of the present disclosure has a particular thermosetting property. The thermosetting property provides an advantage in that the adhesive layer 270 can flow well for a time period while it is cured under high temperature, so that it can effectively fill the area in the bezel area BA over the buffer layer 235d.

The adhesive layer 270 can have a thickness of less than 20 μm. The space where the adhesive layer is not attached on the substrate, as discussed above, occurs more easily and largely as the thickness of the adhesive layer 270 is smaller. This is because the adhesive layer 270 with a thickness less than 20 μm cannot sufficiently fill the space in case of the related art as explained above. In contrast, in the OLED device 200 according to an exemplary embodiment of the present disclosure, the first buffer layer 235d is disposed in the bezel area BA to suppress the space where the adhesive layer is not attached on the substrate, even with the adhesive layer 270 with a thickness of less than 20 μm.

The upper substrate 215 is disposed to face the lower substrate 210 and supports thereon a variety of elements of the OLED device 200. The upper substrate 215 may be made of a flexible material and may be made of the same material as the lower substrate 210. Although the lower substrate 210 includes the display area DA and the bezel area BA herein, the upper substrate 215 may also have a display area and a bezel area similarly to the lower substrate 210.

The upper substrate 215 may be made of one of copolyester thermoplastic elastomer (COP), cycoolefin copolymer (COC) and polycarbonate (PC) which can suppress moisture permeation via the front surface of the display area DA. In addition, the upper substrate 215 has optically isotropic properties for improving image quality of the display area DA.

The upper substrate 215 may be made of the same material as the lower substrate 210. If the upper substrate 215 is made of polyimide, multi-buffer layers may be further disposed between the upper substrate 215 and the adhesive layer 270. The multi-buffer layers may be four layers formed by alternately stacking silicon nitride SiNx and silicon oxide SiOx. Such buffer layers are necessary because polyimide cannot effectively suppress moisture permeation, although it is suitable for forming various insulating layers and metal lines. Accordingly, an additional element for suppressing moisture permeation via the front surface, such as multi-buffer layers, is necessary. Additionally, if the upper substrate 215 is made of polyimide, a touch sensor, a temperature sensor, an optical sensor, etc., may be disposed on the upper substrate 215.

Figure 4:
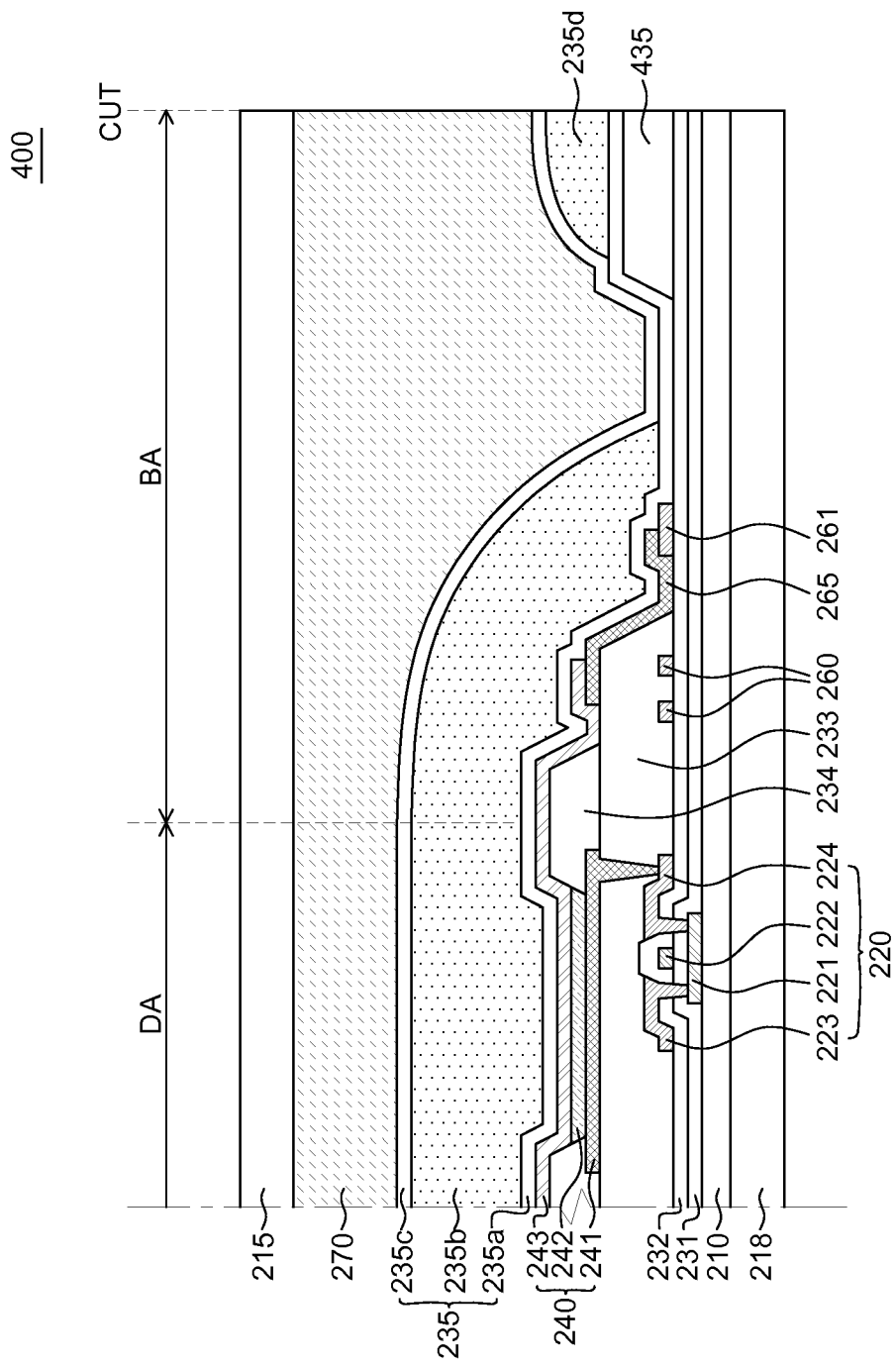
FIG. 4 is a schematic cross-sectional plan view of an OLED device according to another exemplary embodiment of the present invention.

FIG. 4 is a schematic cross-sectional view of an OLED device according to another exemplary embodiment of the present disclosure. Referring to FIG. 4, the bezel area BA of the OLED device 400 includes a first buffer layer for reducing step difference 235d and a second buffer layer for reducing step difference 435. The second buffer layer 435 is disposed under the first encapsulation layer 235a. Further, the first buffer layer 235d is on the second buffer layer 435. With this configuration, the space where the adhesive layer is not attached on the substrate in the bezel area BA can be reduced by the first buffer layer 235d and the second buffer layer 435. In particular, it is possible to suppress the space where the adhesive layer is not attached on the substrate, even with the adhesive layer 270 with a thickness of less than 20 μm. The second buffer layer 435 is configured to further reduce the area between the upper substrate 215 and the lower substrate 210 at the bezel area BA.

The second buffer layer for reducing step difference 435 of the OLED device 400 according to another exemplary embodiment of the present disclosure is made of the same material as a bank layer 234. Accordingly, the second buffer layer 435 can be formed together with the bank layer 234 in the same process by simply changing the mask, without requiring an additional process. In some embodiments, the second buffer layer 435 may be made of the same material as the planarization layer 233, and may be formed together with the planarization layer 233 in the same process by simply changing the mask, without requiring an additional process.

The second buffer layer 435 has a flat surface and has a larger width than the first buffer layer 235d. As the second buffer layer 435 is wider than the first buffer layer 235d, the first buffer layer 235d does not easily flow down along the tapered shape of the second buffer layer 435. In particular, if the adhesive layer 270 is made of a thermosetting resin which flows well, it is desirable to make the surface on which the first buffer layer 235d is formed flat.

The other elements of the OLED device 400, other than those described above, are or can be substantially identical to those of the OLED device 200; and, therefore, will not be described to avoid redundancy.

Figure 5:
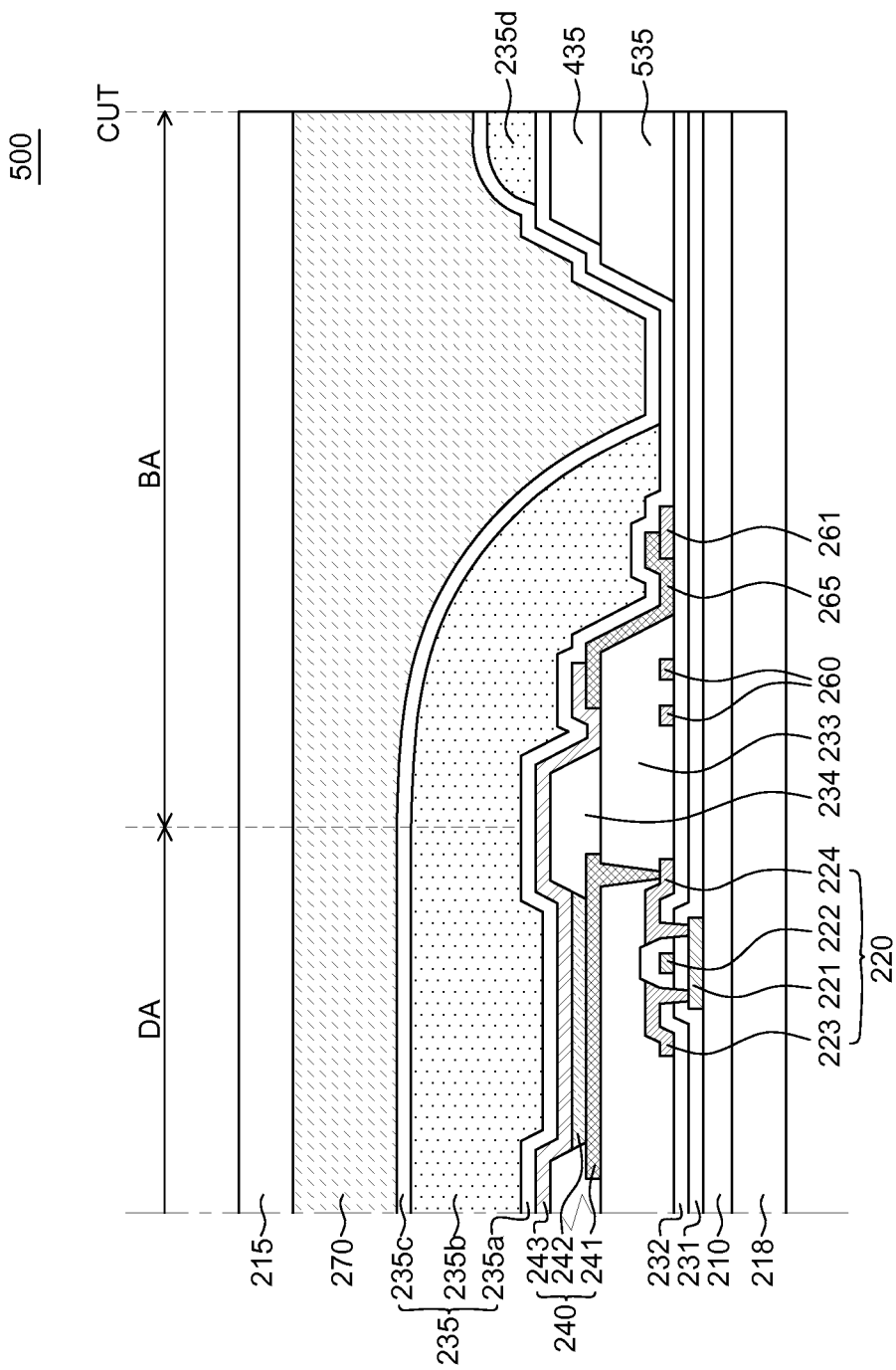
FIG. 5 is a schematic cross-sectional plan view of an OLED device according to another exemplary embodiment of the present invention.

FIG. 5 is a schematic cross-sectional view of an OLED device according to the other exemplary embodiment of the present disclosure. Referring to FIG. 5, in a bezel area BA of an OLED device 500, a first buffer layer for reducing step difference 235d, a second buffer layer for reducing step difference 435 and a third buffer layer for reducing step difference 535 are disposed. The second buffer layer 435 is disposed on the third buffer layer 535. The first buffer 235d and the second buffer layer 435 are on the third buffer layer 535. With this configuration, the space where the adhesive layer is not attached on the substrate in the bezel area BA can be further reduced by the first buffer layer 235d, the second buffer layer 435 and the third buffer layer 535. In particular, it is possible to significantly suppress the space where the adhesive layer is not attached on the substrate, even with the adhesive layer 270 with a thickness of less than 20 µm.

The third buffer layer 535 for reducing step difference of the OLED device 500 according to the other exemplary embodiment of the present disclosure is made of the same material as the planarization layer 233. The second buffer layer 435 is made of the same material as the bank layer 234. Accordingly, the second buffer layer 435 and the third buffer layer 535 can be formed together with the planarization layer 233 and the bank layer 234, respectively, in the same processes by simply changing the masks, without requiring an additional process.

The third buffer layer 535 may have a larger width than that of the second buffer layer 435. As the third buffer layer 535 is wider than the second buffer layer 435, the first buffer layer 235d does not easily flow down along the tapered shape of the third buffer layer 535.

The other elements of the OLED device 500, other than those described above, are or can be substantially identical to those of the OLED device 400 described above; and, therefore, will not be described to avoid redundancy.

Figure 6:
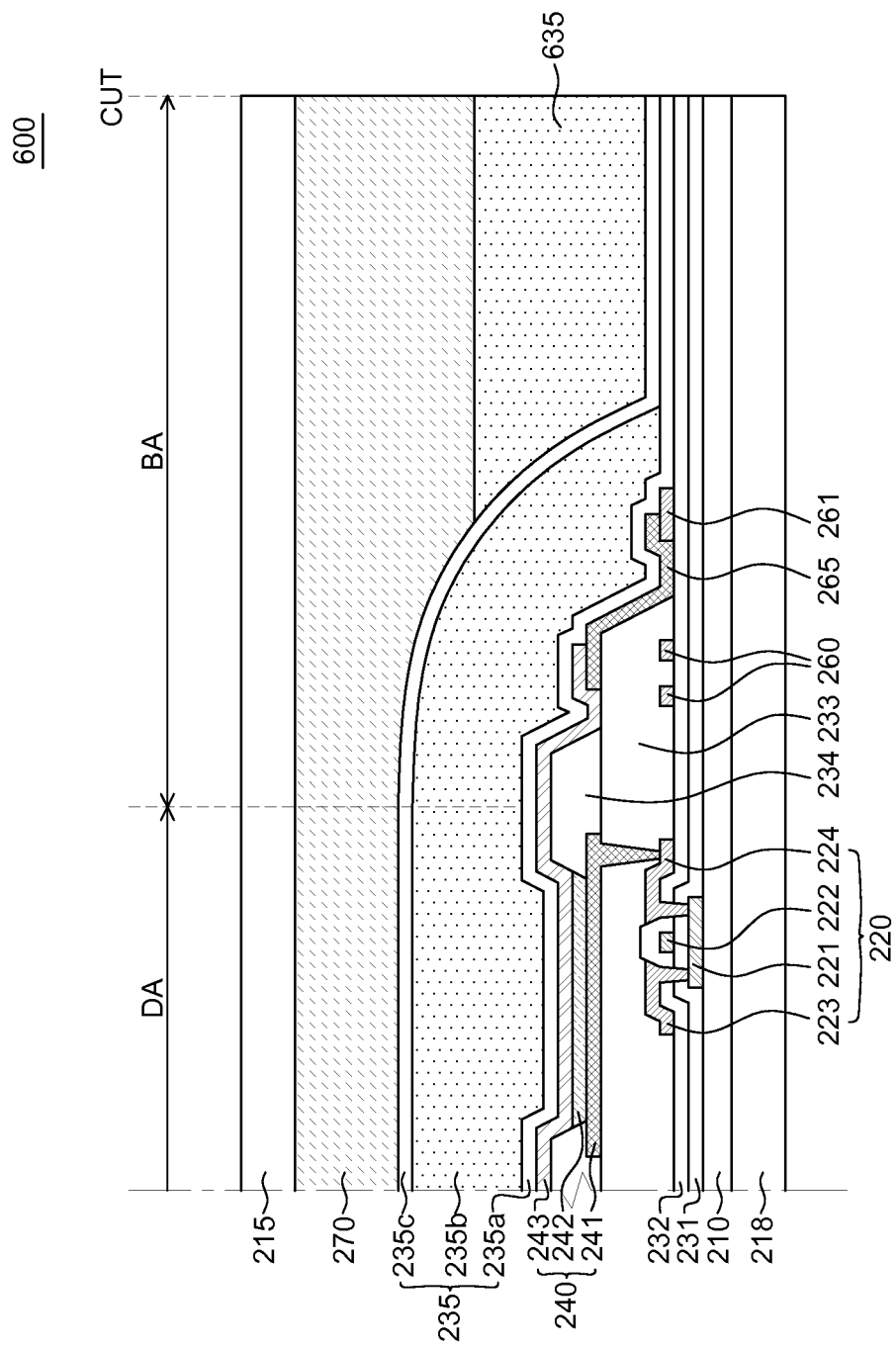
FIG. 6 is a schematic cross-sectional plan view of an OLED device according to another exemplary embodiment of the present invention.

FIG. 6 is a cross-sectional view of an OLED device according to another exemplary embodiment of the present disclosure. Referring to FIG. 6, in a bezel area BA of an OLED device 600, a first buffer layer for reducing step difference 635 is formed on a second encapsulation layer 235c. With this configuration, almost the whole space where the adhesive layer is not attached on the substrate in the bezel area BA can be filled with the first buffer layer 635. In particular, it is possible to suppress the space where the adhesive layer is not attached on the substrate, even with the adhesive layer 270 with a thickness of less than 10 µm.

The first buffer layer for reducing step difference 635 of the OLED device 600 according to another exemplary embodiment of the present disclosure is made of the same material as the first particle cover layer 235b. In particular, as almost the whole space is filled with the first buffer layer 635, the adhesive layer 270 made of a thermosetting resin or a pressure-sensitive material can be used. In addition, the thickness of the adhesive layer 270 may be less than 5 µm.

The other elements of the OLED device 600, other than those described above, are or can be substantially identical to those of the OLED device 400 described above; and, therefore, will not be described to avoid redundancy.

Figure 7:
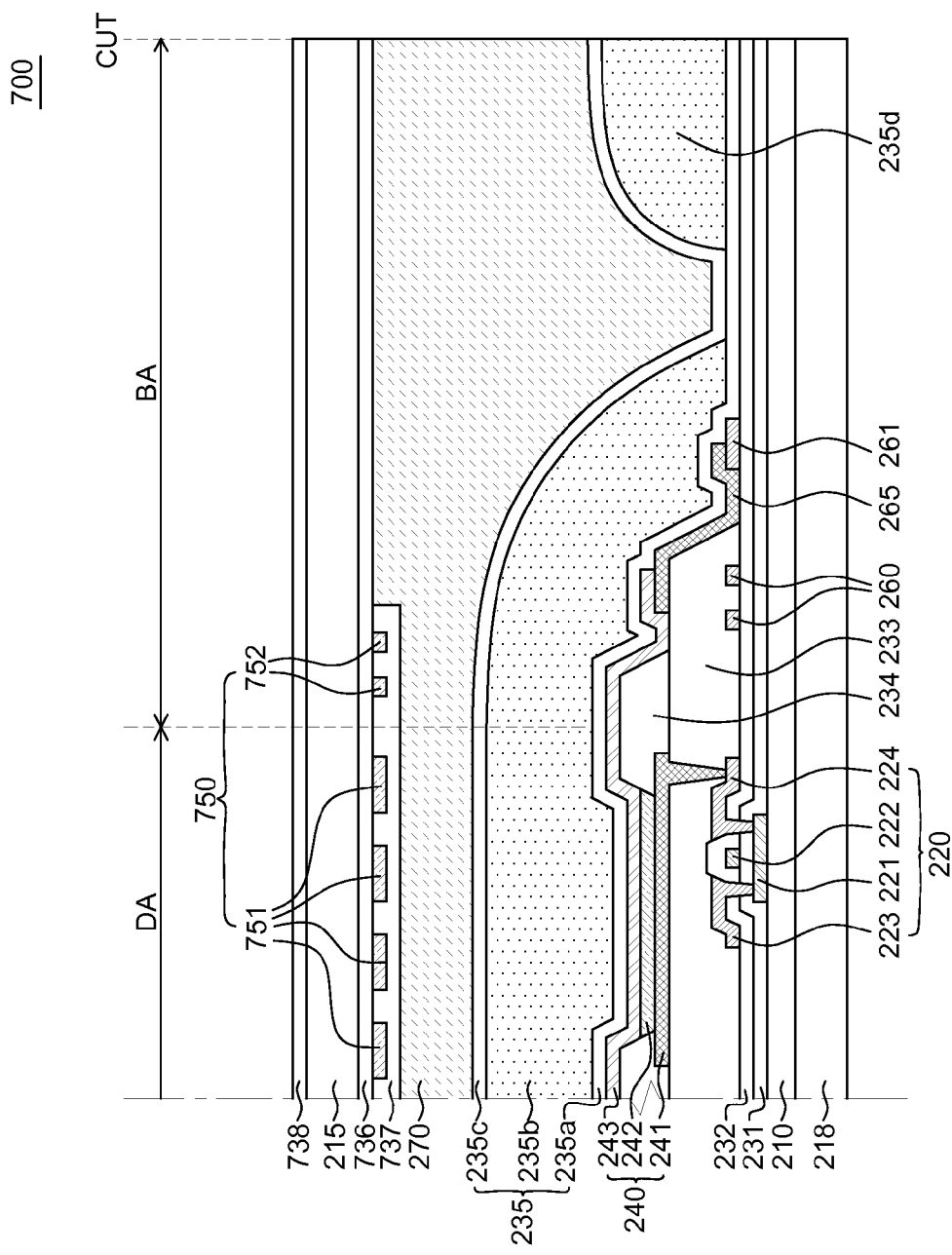
FIG. 7 is a schematic cross-sectional plan view of an OLED device according to another exemplary embodiment of the present invention.

FIG. 7 is a cross-sectional view of an OLED device according to another exemplary embodiment of the present disclosure. Referring to FIG. 7, a touch sensing unit 750 is disposed on an upper substrate 215 of an OLED device 700. Multi-buffer layers 736 are disposed under the upper substrate 215. The multi-buffer layers 736 act as layers for protecting the touch sensing unit 750 and the organic light-emitting element 240 from the moisture and oxygen permeating via the upper substrate 215. The multi-buffer layers 736 are formed in the display area DA and the bezel area BA under the upper substrate 215.

The touch sensing unit 750 is disposed under the upper substrate 215. Specifically, the touch sensing unit 750 is disposed on the bottom surface of the multi-buffer layers 736 under the upper substrate 215. The touch sensing unit 750 includes touch sensing electrodes 751 disposed in the display area DA and touch lines 752 disposed in the bezel area BA. The touch lines 752 deliver touch sensing signals from the touch sensing electrodes 751. The touch sensing unit 750 may be formed below the upper substrate 215 as shown in FIG. 7. In that case, in the OLED device 700 according to another exemplary embodiment of the present disclosure, an in-cell type touch screen panel can be implemented.

An overcoat layer 737 may be disposed under the touch sensing unit 750. The overcoat layer 737 planarizes the area below the touch sensing unit 750 and is formed in the display area DA and the bezel area BA between the upper substrate 215 and the adhesive layer 270. The overcoat layer 737 may be made of the same material as the planarization layer 233.

Then, as shown in FIG. 7, a polarizing plate 738 is disposed on the top surface of the upper substrate 215. The polarizing plate 738 is an element for minimizing reflections of external light by reflective material of the OLED device 700 and may be disposed on the top surface of the upper substrate 215. The polarizing plate 738 is an optional element and thus may not be included in the OLED 700. Instead of the polarizing plate 738, another element for reducing reflections of external light may be included in the OLED device 700 or one of existing elements of the OLED device 700 may be altered.

The other elements of the OLED device 700, other than those described above, are or can be substantially identical to those of the OLED device 200 described above; and, therefore, will not be described to avoid redundancy.

The exemplary embodiments of the present disclosure can also be described as follows:

An organic light-emitting display device comprises a display area including a thin-film transistor and an organic light-emitting element on a lower substrate; a bezel area configured to surround the display area; a transparent encapsulation unit including at least a first encapsulation layer, a first particle cover layer and a second encapsulation layer; and a first buffer layer, wherein the first encapsulation layer, on the organic light-emitting element, covers the display area and the bezel area, wherein the first particle cover layer, on the first encapsulation layer, covers the display area and at least a portion of the bezel area adjacent to the display area, wherein the first buffer layer, apart from the first particle cover layer, on the first encapsulation layer, covers at least another portion of the bezel area, and wherein the second encapsulation layer, which covers the first particle cover layer and the first buffer layer, is in contact with the first encapsulation layer at a contact surface between the first particle cover layer and the first buffer layer.

A width of the contact surface may be determined by a distance between the first buffer layer and the first particle cover layer.

The width of the contact surface may be equal to or less than approximately 200 μm.

The width of the contact surface may be equal to or greater than approximately 50 μm.

The organic light-emitting display device may further comprise an upper substrate facing the lower substrate and an adhesive layer between the lower substrate and the upper substrate, wherein the first buffer layer is configured to reduce an area between the upper substrate and the lower substrate at the bezel area such that the adhesive layer fills up the reduced area at the bezel area.

The first buffer layer may be made of a same material as the first particle cover layer.

The first buffer layer may be configured to absorb physical impacts generated when the lower substrate and the upper substrate are cut.

The organic light-emitting display device may further comprise a second buffer layer under the first buffer layer and configured to further reduce the area between the upper substrate and the lower substrate at the bezel area and the second buffer layer may be made of a same material as a bank layer.

The second buffer layer may have a flat top surface.

The first buffer layer may be overlapped with the second buffer layer and a width of the second buffer layer may be wider than a width of the first buffer layer.

The organic light-emitting display device may further comprise a third buffer layer under the second buffer layer, and the third buffer layer may be made of a same material as a planarization layer and may be configured to further reduce the area between the upper substrate and the lower substrate at the bezel area.

The second buffer layer may be overlapped with the third buffer layer and a width of the third buffer layer may be wider than the width of the second buffer layer.

The first encapsulation layer and the second encapsulation layer may be made of an inorganic substance and the first particle cover layer and the first buffer layer may be made of an organic substance.

The organic light-emitting display device may further comprise an upper substrate facing the lower substrate and the organic light-emitting display device may be a top emission type in which light generated in the organic light-emitting element is emitted via the upper substrate.

A thickness of the adhesive layer may be equal to or less than approximately 20 μm.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. An organic light-emitting display device comprising:
    a display area including a thin-film transistor and an organic light-emitting element on a lower substrate;
    a bezel area configured to surround the display area;
    a transparent encapsulation unit including at least a first encapsulation layer, a first particle cover layer and a second encapsulation layer; and
    a first buffer layer disposed in the bezel area,
    wherein the first encapsulation layer, on the organic light-emitting element, covers the display area and the bezel area,
    wherein the first particle cover layer, on the first encapsulation layer, covers the display area and at least a portion of the bezel area adjacent to the display area,
    wherein the first buffer layer, apart from the first particle cover layer, on the first encapsulation layer, covers at least another portion of the bezel area,
    wherein the second encapsulation layer, which covers the first particle cover layer and the first buffer layer, is in contact with the first encapsulation layer at a contact surface between the first particle cover layer and the first buffer layer,
    wherein the first buffer layer is interposed between the first and second encapsulation layers in the bezel area, and
    wherein the first buffer layer is made of a same material as the first particle cover layer.

2. The organic light-emitting display device of claim 1, wherein a width of the contact surface is determined by a distance between the first buffer layer and the first particle cover layer.

3. The organic light-emitting display device of claim 2, wherein the width of the contact surface is equal to or less than approximately 200 μm.

4. The organic light-emitting display device of claim 2, wherein the width of the contact surface is equal to or greater than approximately 50 μm.

5. The organic light-emitting display device of claim 1, further comprising an upper substrate facing the lower substrate and an adhesive layer between the lower substrate and the upper substrate,
    wherein the first buffer layer is configured to reduce an area between the upper substrate and the lower substrate at the bezel area such that the adhesive layer fills up the reduced area at the bezel area.

6. The organic light-emitting display device of claim 5, wherein the first buffer layer is configured to absorb physical impacts generated when the lower substrate and the upper substrate are cut.

7. The organic light-emitting display device of claim 5, further comprising a second buffer layer under the first buffer layer and configured to further reduce the area between the upper substrate and the lower substrate at the bezel area, the second buffer layer being made of a same material as a bank layer.

8. The organic light-emitting display device of claim 7, wherein the second buffer layer has a flat top surface.

9. The organic light-emitting display device of claim 7, wherein the first buffer layer is overlapped with the second buffer layer and a width of the second buffer layer is wider than a width of the first buffer layer.

10. The organic light-emitting display device of claim 7, further comprising a third buffer layer under the second buffer layer,
    wherein the third buffer layer is made of a same material as a planarization layer and is configured to further reduce the area between the upper substrate and the lower substrate at the bezel area.

11. The organic light-emitting display device of claim 10, wherein the second buffer layer is overlapped with the third buffer layer and a width of the third buffer layer is wider than the width of the second buffer layer.

12. The organic light-emitting display device of claim 1, wherein the first encapsulation layer and the second encapsulation layer are made of an inorganic substance, and the first particle cover layer and the first buffer layer are made of an organic substance.

13. The organic light-emitting display device of claim 1, further comprising an upper substrate facing the lower substrate, wherein the organic light-emitting display device is a top emission type in which light generated in the organic light-emitting element is emitted via the upper substrate.

14. The organic light-emitting display device of claim 5, wherein a thickness of the adhesive layer is equal to or less than approximately 20 μm.

15. An apparatus comprising:
a first substrate;
a second substrate facing the first substrate;
a display area and a bezel area configured to surround the display area, the display and bezel areas being interposed between the first and second substrates;
a transparent encapsulation unit including at least a first encapsulation layer, a particle cover layer and a second encapsulation layer; and
a buffer layer disposed in contact with a cut line in the bezel area,
wherein the first encapsulation layer covers the display area and the bezel area,
wherein the particle cover layer on the first encapsulation layer covers the display area and at least a portion of the bezel area adjacent to the cut line,
wherein the buffer layer apart from the particle cover layer on the first encapsulation layer covers at least another portion of the bezel area adjacent to the cut line,
wherein the second encapsulation layer, which covers the particle cover layer and the buffer layer, is in contact with the first encapsulation layer at a contact surface between the particle cover layer and the buffer layer, and
wherein the buffer layer is interposed between the first and second encapsulation layers in the bezel area.

16. The apparatus of claim 15, wherein the buffer layer is made of a same material as the particle cover layer.

17. The apparatus of claim 16, wherein the buffer layer is configured to absorb physical impacts generated near the cut line.

18. The apparatus of claim 17, wherein the buffer layer further comprises a plurality of buffer sub-layers to improve reliability characteristics.

19. The apparatus of claim 18, wherein widths of the buffer sub-layers are configured to be narrower towards the second substrate.

20. A display panel comprising:
an upper substrate;
a lower substrate opposing the upper substrate, and configured to have organic light emitting diode (OLED) display elements thereon, the lower substrate having a display area and a non-display area adjacent to or surrounding the display area;
an encapsulation in the display area and extending into a portion of the non-display area, and configured to encapsulate the OLED display elements, wherein the encapsulation includes a first encapsulation layer, a second encapsulation layer, and a buffer layer interposed between the first and second encapsulation layers in the non-display area;
an adhesive on the encapsulation and on portions of the non-display area not covered by the encapsulation, and configured to allow attachment of the upper substrate to the lower substrate; and
a structure on the lower substrate at an edge thereof in the non-display area in which two or more layers are stacked, wherein the two or more layers are made of different materials, the structure configured to have a specific thickness and a specific width that serve a dual purpose of protecting the OLED display elements and improving adhesiveness between the upper and lower substrates, when compared to a display panel that lacks the structure.

21. The display panel of claim 20, wherein the dual purpose is achieved by the specific thickness and the specific width being sufficient to minimize effects to the OLED display elements caused by a mother substrate cutting procedure and to reduce formation of possible spaces, gaps or air bubbles in the adhesive.

22. The display panel of claim 21, wherein the encapsulation further includes a particle cover layer in the display area and the structure is made of a same material as that of the particle cover layer.

23. The display panel of claim 22, wherein the specific thickness is approximately 20 μm and the specific width is within a range from 50 μm to 200 μm.

* * * * *